United States Patent [19]

Akatsu et al.

[11] Patent Number: 5,375,227
[45] Date of Patent: Dec. 20, 1994

[54] METHOD OF AND APPARATUS FOR AUTOMATIC RECOVERY OF A CACHE IN A STORAGE SYSTEM

[75] Inventors: Masaharu Akatsu; Tomohiro Murata, both of Yokohama; Kenzou Kurihara, Meguro; Morihiko Yotsuya, Odawara; Koji Ozawa, Hiratsuka, all of Japan

[73] Assignee: Hitachi, Ltd., Tokyo, Japan

[21] Appl. No.: 573,784

[22] Filed: Aug. 28, 1990

[30] Foreign Application Priority Data

Aug. 29, 1989 [JP] Japan ................... 1-222615

[51] Int. Cl.5 ............................ G06F 13/14
[52] U.S. Cl. ................... 395/575; 395/400; 395/425; 395/275
[58] Field of Search ............ 395/425, 575; 371/21.1, 371/12, 16, 13, 14

[56] References Cited

U.S. PATENT DOCUMENTS

| 4,357,656 | 11/1982 | Saltz et al. | 395/425 |
| 4,593,354 | 6/1986 | Ushiro | 395/425 |
| 4,667,288 | 5/1987 | Keeley et al. | 395/575 |
| 4,686,621 | 8/1987 | Keeley et al. | 371/21.1 |
| 4,819,203 | 4/1989 | Shiroyangi et al. | 395/425 |
| 4,891,809 | 2/1988 | Hazawa | 321/3 |
| 4,996,641 | 2/1991 | Talgam et al. | 395/425 |
| 5,019,971 | 5/1991 | Lefsky et al. | 395/575 |
| 5,070,502 | 12/1991 | Supnik | 371/10.2 |
| 5,142,627 | 8/1992 | Elliot et al. | 395/275 |
| 5,155,844 | 11/1992 | Cheng et al. | 395/575 |

*Primary Examiner*—Alyssa H. Bowler
*Assistant Examiner*—L. Donaghue
*Attorney, Agent, or Firm*—Antonelli, Terry, Stout & Kraus

[57] ABSTRACT

Herein disclosed is a disk controller having a cache. This cache is so managed that a predetermined part composed of at least one of a plurality parts divided therefrom is initialized. In response to a request for cache activation from a host computer, the initializations of the cache are partly executed in a repeated manner, and a request for disk input/output is intermittently processed so that the whole initializations of a cache having a large capacity can be executed in parallel with the online process.

Moreover, the logic failure of the cache and the hardware failure of a memory are divided. When the logic failure occurs, the use of the case is temporarily prohibited, and the whole initializations of the cache are executed automatically at the side of the disk controller without any intervention of a maintenance man so that the cache can be used again.

14 Claims, 8 Drawing Sheets

METHOD OF AND APPARATUS FOR AUTOMATIC RECOVERY OF A CACHE IN A STORAGE SYSTEM

BACKGROUND OF THE INVENTION

The present invention relates to a method of and an apparatus for activating a cache during an online operation in a disk system such as a magnetic disk or an optical disk incorporating the cache and, more particularly, to a method of and an apparatus for making it possible to perform maintenance on the cache and automatic closure and recovering of the cache during online operation thereof.

In a computer system of the type described, a reference by a processor to a memory has the following characteristics:

(a) References of several times to common information; and
(b) Reference to information stored nearby when certain information is referred to. Thanks to these characteristics, a memory having apparently high speed and large capacity can be realized by combining a memory of high speed and small capacity and a memory of low speed and large capacity in a two hierarchy arrangement.

What is used with most frequency as an auxiliary memory is a magnetic disk unit, which has an access time as large $10^5$ times that of the main memory. In order to reduce this gap between the access times, there is provided a buffer memory (which is called the "disk cache" and will be shortly referred to as the "cache") for the magnetic disk to realize a memory having the aforementioned apparently high speed and large capacity.

Such disk controllers having a cache are disclosed in the following references concerning control relating to the cache which may be performed during online operation:

(a) When the cache is in an ordinary status, it is switched whether or not the cache is to be used; and
(b) The use of the cache is prohibited when a failure occurs around the cache.

The detailed contents of these operations are disclosed in Japanese Patent Laid-Open No. 60-79447.

In the disk controller having the cache according to this publication, the control method relating to the cache which is activatable during online operations has been incapable of executing a control in which the cache is used again after its use has been prohibited due to some failure. In order to replace the cache with a new cache or to initialize the cache, more specifically, the disk controller has to be brought into an off-line status to interrupt the disk input/output process.

This raises a problem that the input/output process of the disk itself is stopped during the maintenance of the cache.

In the prior system, moreover, the following problems arise for the maintenance during online operations.

The time period for initializing the changed cache is far longer than the allowance time after a request for input/output process has been issued from a host computer at a higher rank before the disk controller returns a response of accepting the request. If the initialization is started exclusively by a certain processor in the disk controller, the storage path having been controlled by that processor cannot accept the request for the disk input/output process. As a result, it is impossible in fact to execute the maintenance without exerting serious influences upon the online process.

If a cache failure occurs, on the other hand, a control is carried out to prohibit the use of the cache. This prohibition is not limited to the instant when the hardware failure of the cache itself occurs. Even if no failure occurs in the hardware of the cache itself, the processor may malfunction in the course of a series of write sequences in the cache to break the power temporarily. If the contents written in the cache cannot be secured, the use of the cache is likewise prohibited. Since, in this case, there is no failure in the hardware of the cache itself, the cache could be reused if initialized. For this reuse, the maintenance has to be carried out with the power line being off.

SUMMARY OF THE INVENTION

An object of the present invention is to solve the aforementioned problems and to provide a disk controller and a control method which is enabled to initialize the cache without blocking the disk input/output process thereby to maintain the cache during online operation and which is enabled to recover the use of the cache automatically during online operation thereby to improve the operability of the disk controller having the cache in case the hardware of the cache itself is normal even if there arises a failure which makes it impossible to secure the content of the cache.

In order to achieve the above-specified object, according to the present invention, there is provided (1) a disk controller for a disk system including: a host computer; disk means; at least one storage path for controlling a data transfer between said means; and a cache made readable/writable from said storage path, which controller is characterized: in that a request for cache activation is generated when said processor means operates with said cache being unused; in that a predetermined part, which is composed of at least one of a plurality of parts divided from said cache, is initialized in response to said activation request; and at least said predetermined part of said cache is activated after the initialization of said predetermined part has been completed. More specifically, the disk controller is characterized: in that all of the initializations of the cache are executed during online operations by dividing the cache initializations in a plurality of divided parts in response to a request for cache activation from the host computer during the operations in the unavailable status of the cache by using a cache control unit for managing the cache in a plurality of divided parts and in a repeated manner during the unbusy time of the input/output process for the disk; and in that the use of the cache is started at the stage of completion of the whole initializations. Moreover, (2) the unit of dividing said cache of the disk controller, as specified in (1), has a duration for which said disk means can end the initialization for a shorter time period than that for leaving the input/output process request waiting from said host computer. Still moreover, (3) the divided initializations, as specified in (1), comprises: taking out and initializing one part uninitialized; temporarily interrupting the initialization at the instant of the end of said initialization and confirming whether or not there is an input/output process of said disk; and taking out and initializing a next uninitialized part in case there is not input/output process for said disk. Furthermore, there is provided in the disk controller, as specified in (4), a timer for examining whether or not there is a request for the input/output process for said disk from said host computer, at every elapse of a constant time counted by said timer, and said predetermined part is initialized when there is no output request. Furthermore, (5) the disk controller includes a plurality of storage paths and at least one control processor for controlling said storage paths, wherein said predetermined part of said cache is initialized by that one of said control processors, which is not executing the input/output process of said disk, in response to the cache activation request which is issued when said processor is operating without using said cache. Furthermore, (6) the disk controller for the divided initializations of any cache, as specified in (1) to (5), is characterized by: being connected with the service processor; storing a request for cache activation after repairing the failure of the cache memory by the maintenance man through the service processor; returning an acknowledgment to the cache activation request to the service processor; executing the divided initializations of the cache during online operations; and communicating the completion of the divided initializations and the cache activation or the failure of the cache activation due to occurrence of a failure to the service processor thereby to maintain and control the cache. Furthermore, (7) the disk controller for the divided initializations of any cache, as specified in (1) to (5), further comprises: failure content deciding means for deciding whether or not a failure is a hardware failure of said cache itself when it occurs during the access to said cache; and cache data management updating deciding means for deciding whether or not the management information of the data on said cache is being updated, and is characterized by: prohibiting the use of said cache temporarily, by said disk system, for a failure in which the hardware of said cache itself is normal and in which the management information of the data on said cache is being updated; and initializing the predetermined part of said cache to make said cache available thereby to execute the automatic closure and restoration control of said cache.

In the disk controller of the present invention, the cache can be divided and managed into parts which can be initialized by the processor in the disk controller within a time period freed from any timeout error even if the host computer interrupts the disk input/output process during an online process.

In response to a request for cache activation from a host computer, the disk controller executes the initializations of the cache partly executed in a repeated manner, and processes a request for disk input/output intermittently so that all of the initializations of a cache having a large capacity can be executed in parallel with the online process. Likewise, even when the request for the cache activation is issued from the maintenance man, only that part is initialized during the unbusy time of the input/output process from the disk, and these initializations are repeated to execute the whole initializations of the cache of large capacity in parallel with the online process.

Moreover, the logic failure of the cache and the hardware failure of a memory are divided. When the logic failure occurs, the use of the cache is temporarily prohibited, and all of the initializations of the cache are executed automatically at the side of the disk controller without any intervention of a maintenance man so that the cache can be used again.

Thus, the initializations of the cache of large capacity can be completed without exerting serious influences upon the ordinary online process by the initializations.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

The present invention will be described in detail with reference to the accompanying drawings.

Figure 1:
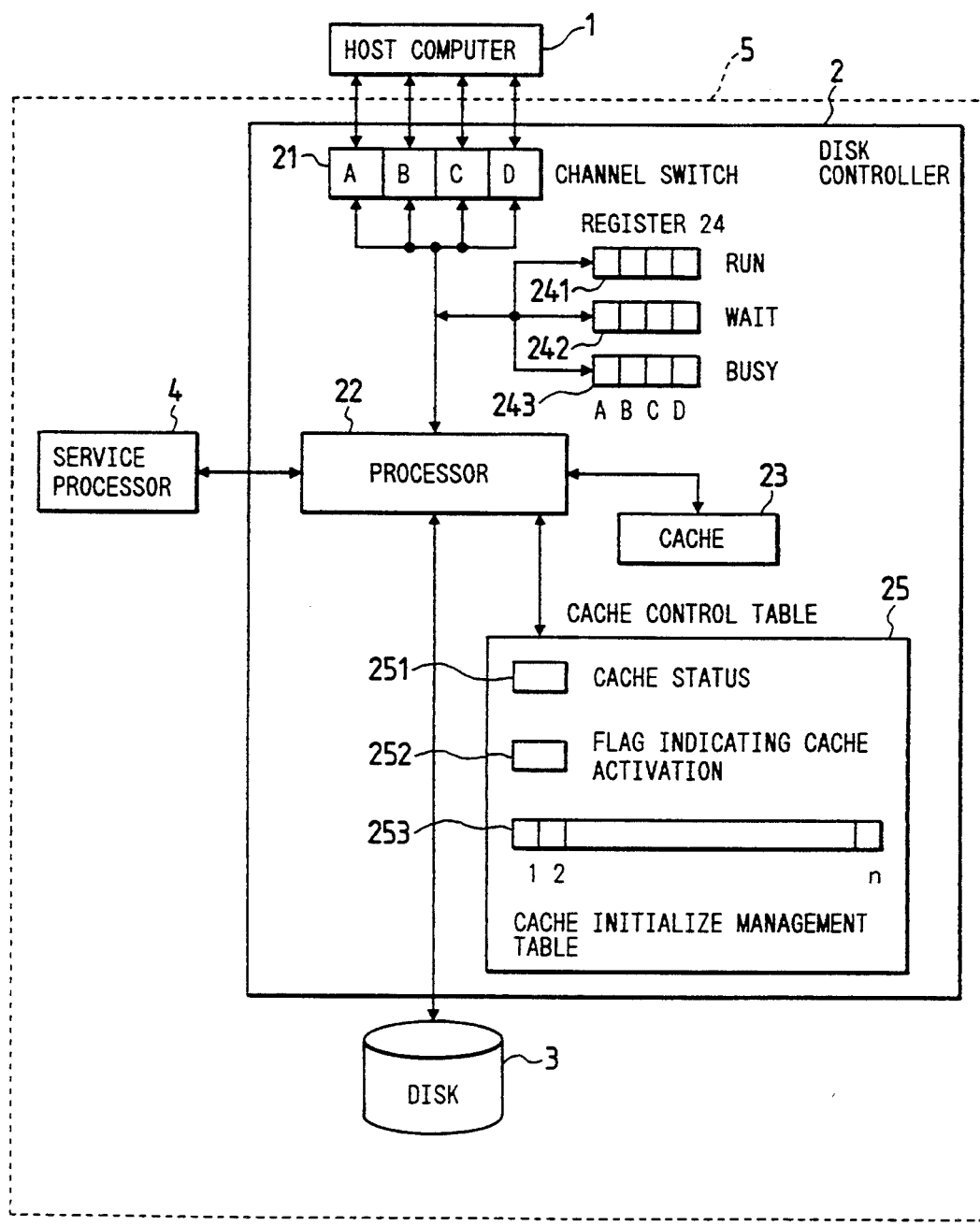
FIG. 1 is a block diagram showing the structure of a computer system according to a first embodiment of the present invention.

FIG. 1 is a block diagram showing the structure of a system including a disk sub-system having a disk controller with a cache in accordance with the present invention.

The system is constructed by connecting a disk sub-system 5, which is composed of a disk controller 2, a disk unit 3 and a service processor 4, with a host computer 1. The disk controller 2 in turn is composed of a channel switch 21, a processor 22, a cache 23, a register group 24 for controlling an answer to a disk input/output request for process (which will be shortly referred to as a "request for processing") from the host computer 1, and a table 25 for controlling the cache 23.

The cache 23 is a volatile memory for storing a copy, if necessary, of a portion of data stored in the disk unit 3. For a request for access to the data stored in advance in the cache 23 (which request will be referred to as "request for access hit" on the cache 23), an access to the cache 23 is made, but no data exchange is carried out with the disk unit 3. This is intended to improve the access responsiveness to the data. Incidentally, the updated data is reflected on the disk unit 3 from the cache 23 while the disk controller 2 is not busy, after having been disconnected from the host computer.

The register group 24 is composed of a Run register 241, a Wait register 242 and a Busy register 243, all of which have one Bit for each channel of the channel switch 21.

The Run register 241 indicates whether or not each channel of the channel switch 21 detects a request for processing from the host computer 1. If YES, corresponding stage of the Run register 241 is set to "1".

The Wait register 242 is set to "1" for a Bit corresponding to a channel of the channel switch 21 if the request for processing from the host computer 1 cannot be received because the processor 22 is executing a process other than that from the host computer 1.

The Busy register 243 indicates whether or not the processor 22 can receive a request for processing from each channel (A, B, C or D) of the channel switch 21. The stage of the Busy register 243 which is set to "1" indicates the channel (A, B, C or D) of the channel switch 21 which cannot accept a request for processing.

The channel switch 21 sets the corresponding Bit of the Run register 241 to "1" so long as the corresponding Bits of the Busy register 243 and the Run register 241 are at "0" when a request for processing from the host computer 1 is detected. Otherwise, it is communicated to the host computer 1 that "the request for processing cannot be accepted because the processor 22 in the disk controller 2 is executing another process at present", and the corresponding Bit of the Wait register 242 is set to "1". In this case, the communication that the request from the disk controller 2 becomes acceptable is awaited for a constant time at the side of the host computer 1. If the communication does not come after expiration of the constant time, it is deemed that a failure has occurred, and a process for the failure is executed.

The cache control table 25 is composed of a cache status 251, a flag 252 indicating a request for cache activation, and a cache initialize management table 253.

The cache status 251 indicates whether or not the cache 23 is available, i.e., an available status for "1" and the unavailable status for "0".

The cache activation request indicating flag 252 indicates the presence or absence of a request for activation of the cache 23, i.e., the presence by "1" and the absence by "0".

The cache initialize management table 253 is one that is effective when the cache activation request indicating flag 252 is set, and indicates whether or not the initialization has been executed for each unit (or an n-divided area) of the cache. The flag "1" indicates that the cache area has been initialized, and the flag "0" indicates that the cache area has not been initialized. One initialization time $t_1$ is expressed by the following equation if the cache has a capacity of M words (which refers to the minimum unit for read/write of the cache) and if the time taken for initializing a cache word is designated at s:

$$t_1 = M/n \times s.$$

Therefore, the value n is set to satisfy the following relation if the allowance time for awaiting a communication of acceptability, after having been informed that the request for processing is not acceptable is designated at $t_2$:

$$t_1 < t_2$$

Next, there will be described a process for the processor 22 of FIG. 1, including the cache activation controlling method of the present invention.

Figure 2:
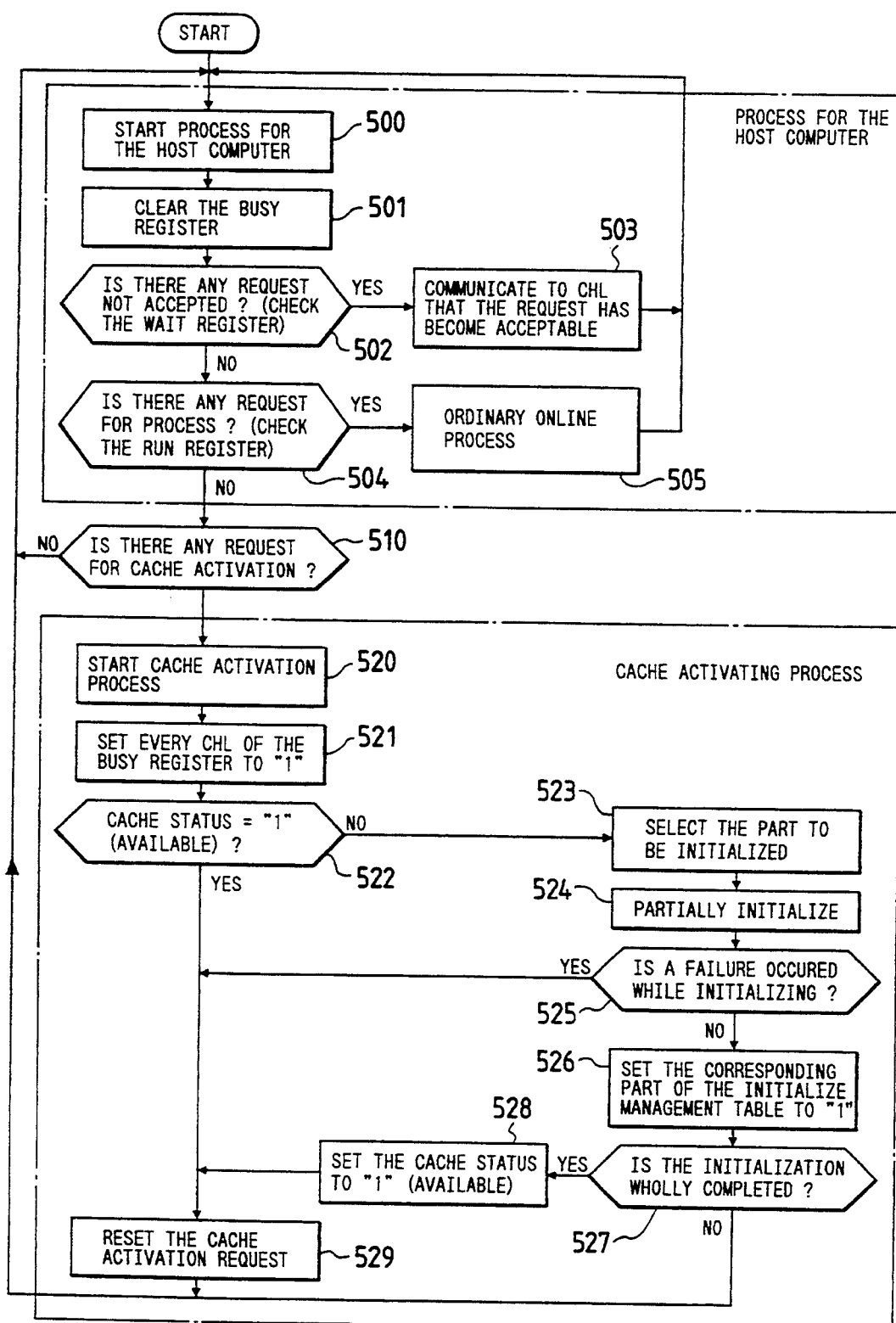
FIG. 2 is a flow chart showing the processing operations of a processor of FIG. 1.

FIG. 2 is a flow chart showing the process operation of the processor 22 of FIG. 1.

First of all, the overall flow will be described in the following.

The process, to be started at Step 500 for the host computer 1 contains Step 501 to Step 505. The process for cache activation to be started at Step 520 contains Step 521 to Step 529.

At first, in the process (of Steps 500 to 505) to be started at Step 500 for the host computer, a request for processing from the host computer 1 is checked. In the absence of the request for processing of the host computer 1, a flag of a request for cache activation is then checked to examine (at Step 510) whether or not there is a request for cache activation. In the absence of a request for cache activation, the procedure returns to the process for the host computer 1 to be started from Step 500, and this scanning is repeated until cache activation is requested.

In the presence of a request for cache activation at Step 510, the cache activation process (at and after Step 520) is started. These are the overall flow processes.

Next, the content of the process (Steps 500 to 505) for the host computer 1 will be described in the following.

At first, the Busy register 243 is cleared (at Step 501) and enabled to accept a request for processing from any channel (A, B, C or D) of the channel switch 21.

Next, the Wait register 242 is checked (at Step 502) to examine whether or not a request for processing is accepted. If YES, it is communicated (at Step 503) through the corresponding channel (A, B, C or D) of the channel switch 21 that the request for processing has become acceptable. In response to this communication, the host computer 1 reissues a request for processing to the appropriate channel.

In case all stages of the Wait register 242 are at "0", the Run register 241 is then checked (at Step 504) to examine whether or not a processing is requested at present. If YES, an ordinary online process is then executed (at Step 505). For this process, the cache status 251 in the cache table 25 is checked. The access process is executed by using the cache 23, if the value "1" is set, but not if the value "0" is set.

Next, the content of a cache activation process (at Steps 520 to 529) will be described in the following.

At first, the Busy register 243 is set to "1" (at Step 521) for all the channels of the channel switch 21. Next, the cache status 251 is checked (at Step 522) to examine whether or not the cache is available. In case the cache has already become available, the cache activation request is invalid, and the cache activation request flag 252 is reset (at Step 529) to end the cache activation process. Then, the procedure is returned again to the process for the host computer to be started from Step 500.

In case the cache 23 is in an unavailable status, the part to be initialized is selected (at Step 523). Specifically, the cache initialize management table 253 is searched to select one part having the value "0". Then, the selected part is partially initialized (at Step 524). In case a k-th part is selected, the part to be initialized is an M/n word having a leading address of $M/n \times (k-1)$.

In case a permanent failure occurs in the cache memory 23 itself during the partial initializing process, the cache activation request flag 252 is reset to end the cache activation process (at Step 529) because it is impossible to continue the cache activation process. Then, the procedure is returned again to the process of Step 500.

In case the partial initialization is ended without any failure, the corresponding entry of the cache initialize management table 253 is set (at Step 526) to "1" and it is determined (at Step 527) whether or not the initialization is wholly completed. If the cache initialize management table 253 is wholly at "1", the initialization is completed.

In case the initialization is not completed, the procedure is returned to the process for the host computer 1 to be started from Step 500, while bypassing the cache activation process (of Steps 520 to 529).

Whether a request for processing has occurred during the initialization is found out at Step 502 before it is timed out by the host computer.

While the cache activation request flag 252 is set at "1", the processes thus far described are repeated until the cache initialization is wholly completed.

When the whole cache initialization is completed, the cache status 251 is set to "1" (at Step 528), and the cache activation request indicating flag 252 is reset (at Step 529) to end the cache activation process. From now on, the cache status 251 is set at "1", and the access is executed by using the cache.

According to the first embodiment thus far described, the cache 23 is initialized during online operations to examine the cache available status if a cache activation request from the host computer 1 is issued during the available status of the cache 23. Moreover, the initialization is not started without any request for the disk input/output request. One time period for the process is shorter than the allowance time (i.e., the time-out monitoring time) after it is communicated that the host computer 1 cannot accept the request for processing and before the communication that the request is acceptable is awaited. This prevents any overlooking of the disk input/output process request from the host computer 1 and raises no danger of causing a timeout of the host computer I/O for the cache initialization.

Here, according to the first embodiment, in the absence of the disk input/output process request, it is examined periodically whether or not the processor 22 executes a cache activation process. From the standpoint of reducing the overhead of the processor 22, it is conceivable to control the start of the cache activation process by using a timer, as will be described in the following.

Figure 3:
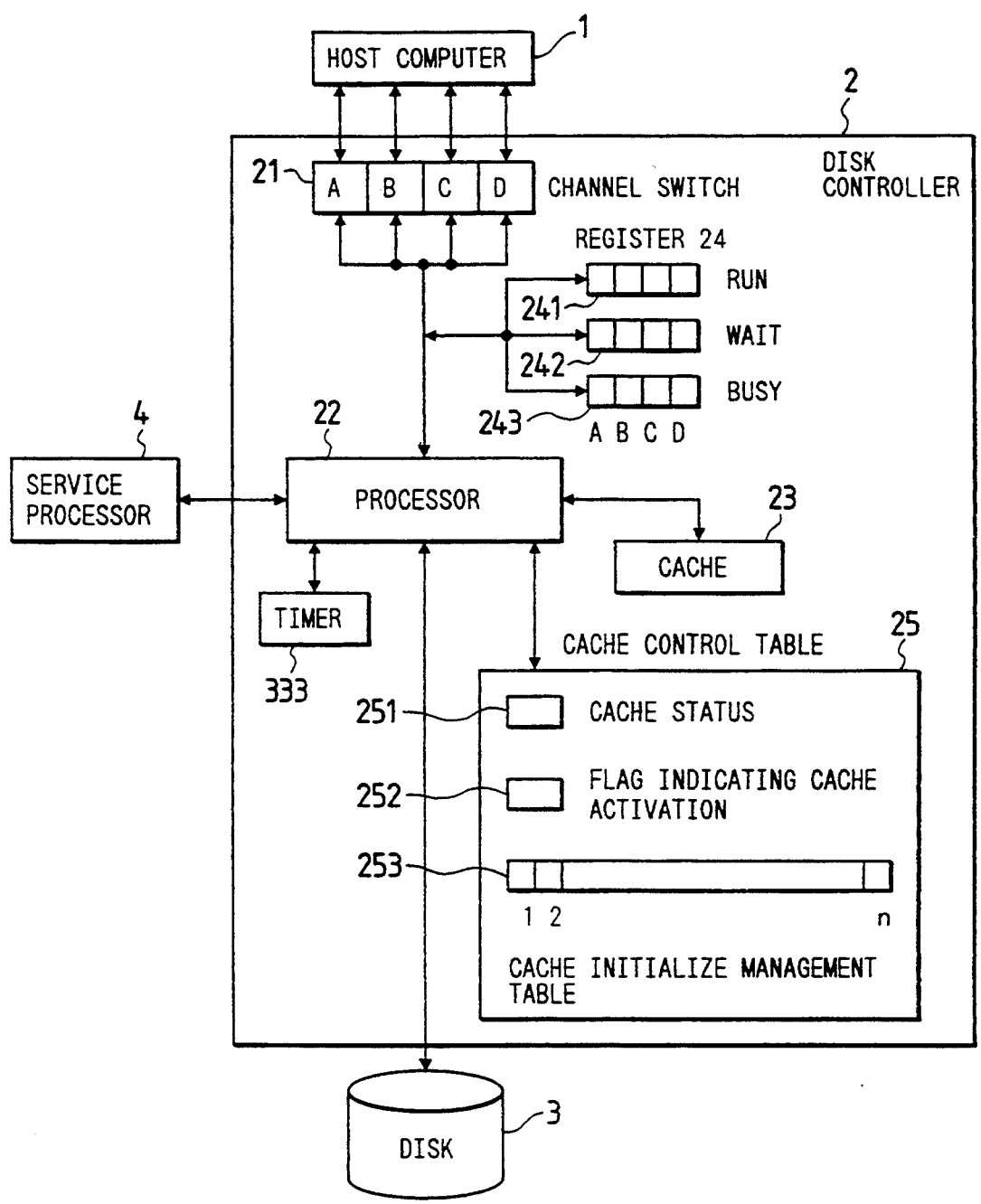
FIG. 3 is a block diagram showing the structure of a computer system according to a second embodiment of the present invention.

FIG. 3 is a block diagram showing the structure of a second embodiment of the present invention.

The structure is made by adding a timer 333 (or software timer) to the computer system of the foregoing first embodiment.

As described above, the timer 333 thus added is used to control the start of the cache activation process.

Figure 4:
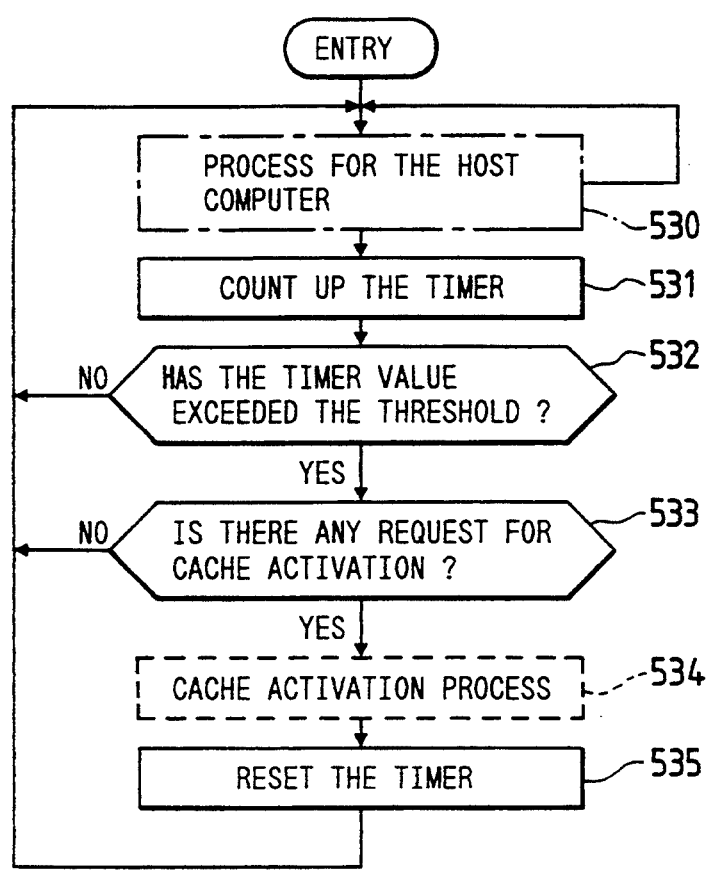
FIG. 4 is a flow chart showing the processing operations of a processor of FIG. 3.

FIG. 4 is a flow chart showing the processing operations of the processor 22 of the second embodiment shown in FIG. 3.

First of all, the process (of Steps 500 to 505) for the host computer 1 of FIG. 1 is executed (at Step 530). In the absence of the request for process from the host computer 1, the timer 333 of FIG. 3 is counted up (at Step 531). It is then examined (at Step 532) whether or not the value of the timer 333 exceeded a preset threshold.

In case the threshold is not exceeded, the procedure is returned to the process of Step 530 without any cache activation process.

In case the threshold is exceeded, it is examined (at Step 533) whether or not there is a request for cache activation. If YES, the cache activation process, as has been described at Steps 520 to 529 of FIG. 2, is executed (at Step 534).

After having passed through the cache activation process (of Step 534), the timer 333 is reset (at Step 535), and the procedure is returned to the process of Step 530.

According to the present embodiment, the starting interval of the cache activation process is elongated if the threshold for the time-out of the timer is made relatively large. This makes it possible to reduce the possibility of leaving the request waiting for the process from the host computer 1. If the threshold is decreased, on the other hand, the time period from the start to the completion of the cache activation process can be shortened despite a high probability of leaving the request waiting for the process from the host computer. Thus, the cache activation process can be smoothly controlled by changing the threshold of the time-out of the timer.

In the second embodiment, the method thus far described uses a software timer. However, it is conceivable to use a hardware timer. In this modification, the processes of Steps 531 and 535 can be dispensed with, and an interruption is made to occur instead when the timer value exceeds the threshold. Then, the procedure may enter the process at and after Step 533 when that interruption is detected. While the ordinary online process is being executed, it is naturally necessary to mask the interruption.

In the embodiments thus far described, the structure corresponds to the case in which the disk controller 2 is equipped with only one processor. Despite this description, however, the present invention can be realized even in a disk controller having a plurality of processors, as will be described in the following.

Figure 5:
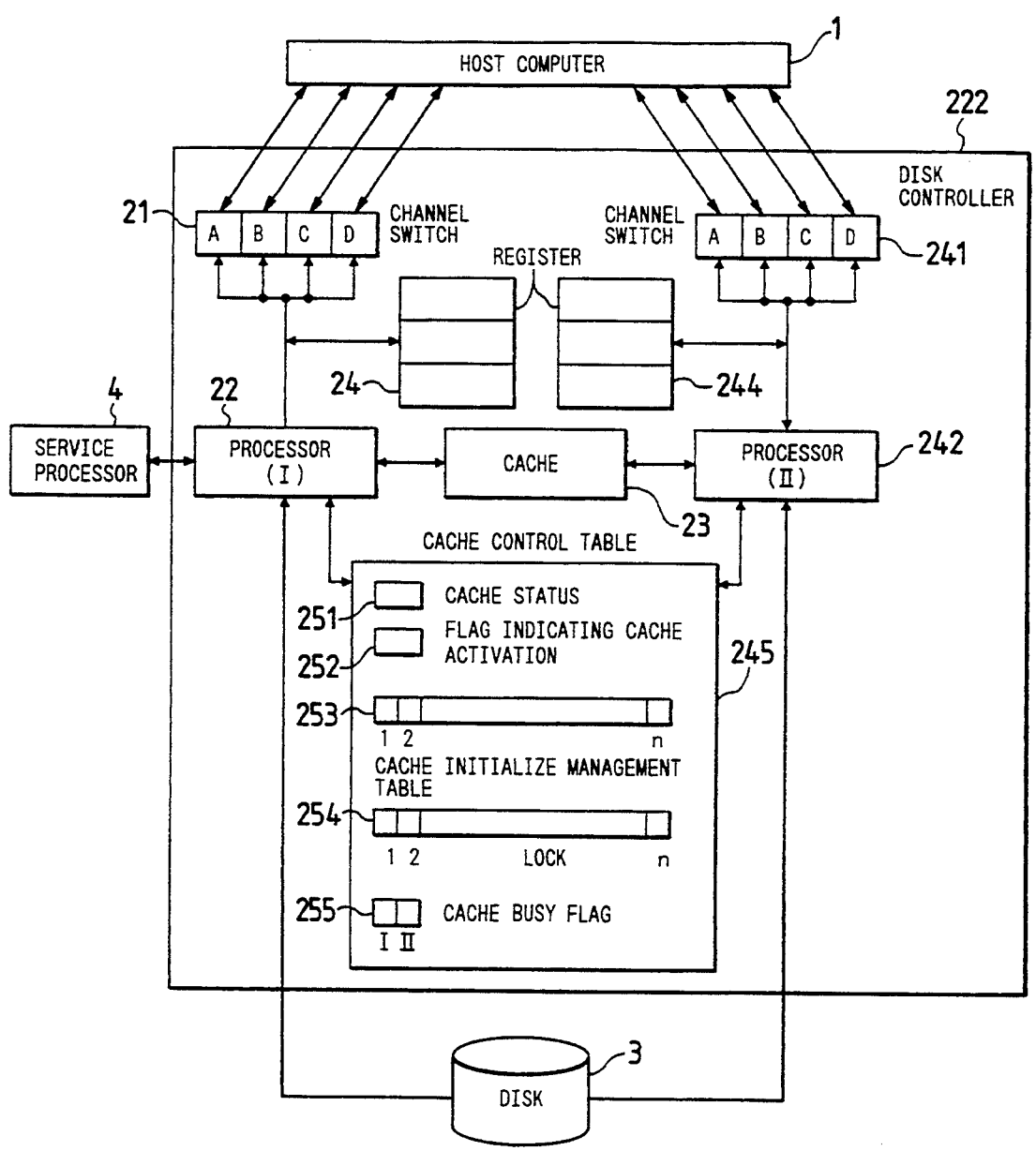
FIG. 5 is a block diagram showing the structure of a computer system according to a third embodiment of the present invention.

FIG. 5 is a block diagram showing the structure of a third embodiment.

This structure is basically similar to that of FIG. 1. A disk controller 222 is arranged therein with the cache control table 245 within the common memory and is provided with a lock 254 for excluding other processors 22 and 242. The lock 254 is prepared at each cache initializing unit and is established, when the initialization of the corresponding part is started, and released when the initialization is ended. This avoids the initialization of the same parts, which might otherwise be executed by the plural processors 22 and 242. These individual processors 22 and 242 execute the processes, which have been described in connection with the aforementioned first embodiment, in parallel while establishing and releasing the lock.

As a result, an unbusy processor (22 or 242) having less requests for process from the host computer 1 can execute more cache activation processes so that it can distribute the load between the processors.

Next, the cache maintaining method in the online operation of a computer system using the aforementioned third embodiment will be described in the following.

Figure 6:
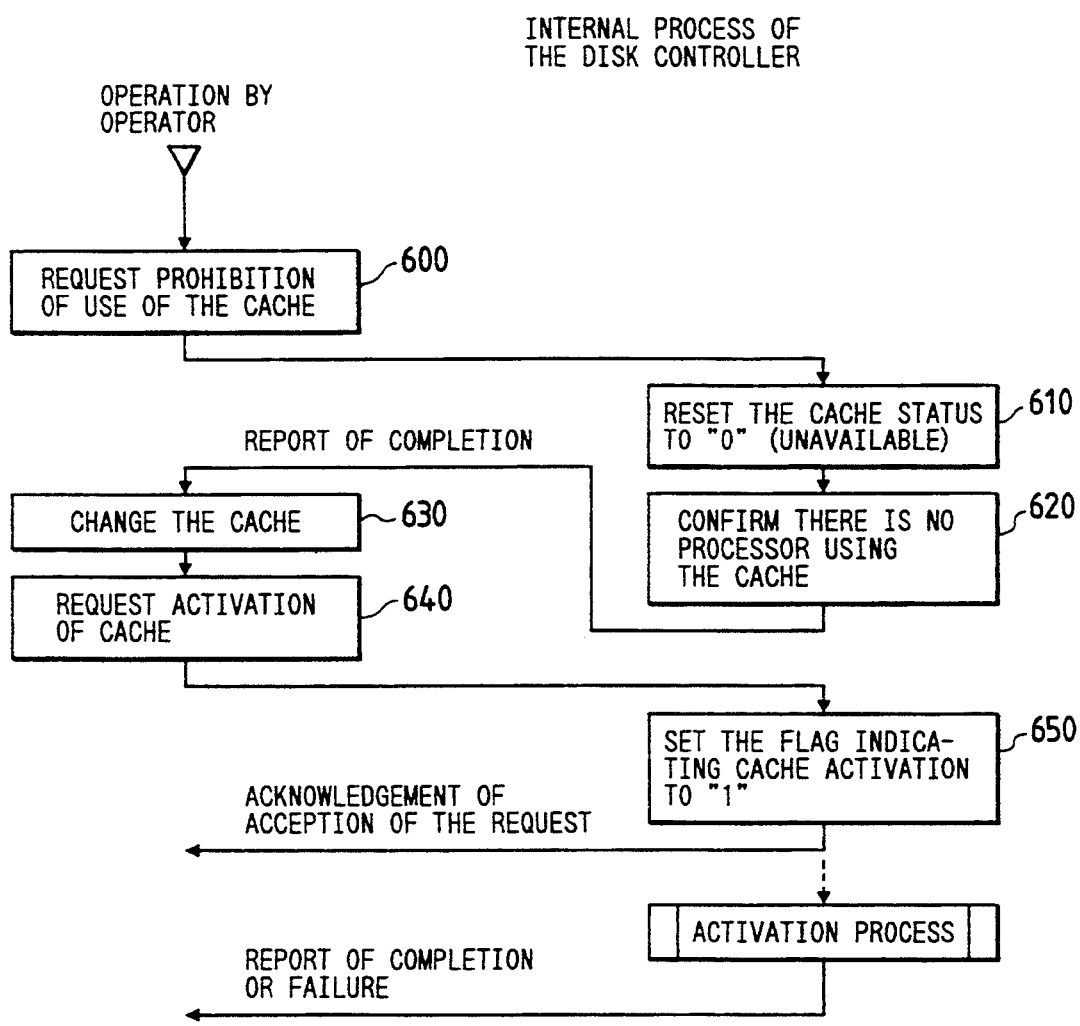
FIG. 6 is a flow chart showing the processing operations of the cache maintenance of the computer system of FIG. 4.

FIG. 6 is a flow chart showing the processing operations of the cache maintenance in the computer system of FIG. 5.

The maintenance man issues a request to the disk controller 222 through the service processor 4.

First of all, the prohibition of use of the cache 23 is requested (at Step 600).

The disk controller 222 drops the cache status 251, when it accepts the use prohibition, to "0" (at Step 610) to set the use prohibition of the cache 23. By this process, the disk controller 222 then executes the access process without using the cache 23.

Here, in FIG. 5, the disk controller 222 is equipped with plural processors (22 and 242) and awaits the end of the processing of another processor having started the cache access before dropping the cache status 251 to "0", to confirm (at Step 620) that there is no processor using the cache 23. This is examined by using a cache busy flag 255. This cache busy flag 255 has 1 bit for each processor so that it raises "1" before the start of use of the cache and drops the value to "0" after the end of the cache use. At the instant when it is confirmed that that the flag is at "0" for all the processors, the completion of cache closure is reported to the service processor 4.

The maintenance man breaks the power to the cache 23, when he accepts the report of completion, to change the cache 23 (at Step 630). At the end of the change, moreover, the maintenance man supplies power to the cache 23 and requests activation of the cache to the disk controller 222 through the service processor 4 (at Step 640).

The disk controller 222, when it accepts the cache activation request, sets the flag 252 indicating cache activation to "1" (at Step 650) to acknowledge the acceptation of the request to the service processor 4. After this, the disk controller 222 and the service processor 4 are disconnected.

This, the aforementioned cache activation process is executed in the disk controller 222. When the whole initialization of the cache 23 is ended, the disk controller 222 reports the completion of the activation process to the service processor 4. On the other hand, a failure of the activation process is reported when the initialization has failed.

Therefore, the maintenance man may await the report of the completion or failure of the activation process after he has accepted the acknowledgment of the cache activation request. In case the activation is completed, the cache 23 is naturally used in an automatic manner, as has been described in the foregoing embodiments.

The description thus far is directed to a disk controller 222 using plural processors. However, a similar online cache maintaining method can be realized even in a computer system for executing control using a single processor, as in the first embodiment and second embodiment. In this case, the aforementioned Steps 610 and 620 are not required, but the procedure skips to the cache change operation (at Step 630) immediately after the request for the prohibition of use of the cache at Step 600.

Thus, according to the first to third embodiments, the maintenance of the cache 23 can be executed online by the maintenance man.

The online maintenance can also be realized according to the procedure, as has been described with reference to FIG. 6, without using the service processor 4, but in response to the request for the cache activation process from the host computer 1.

Next, the method of automatic cache closure and recovering control in the case of a cache failure will be described in the following.

Figure 7:
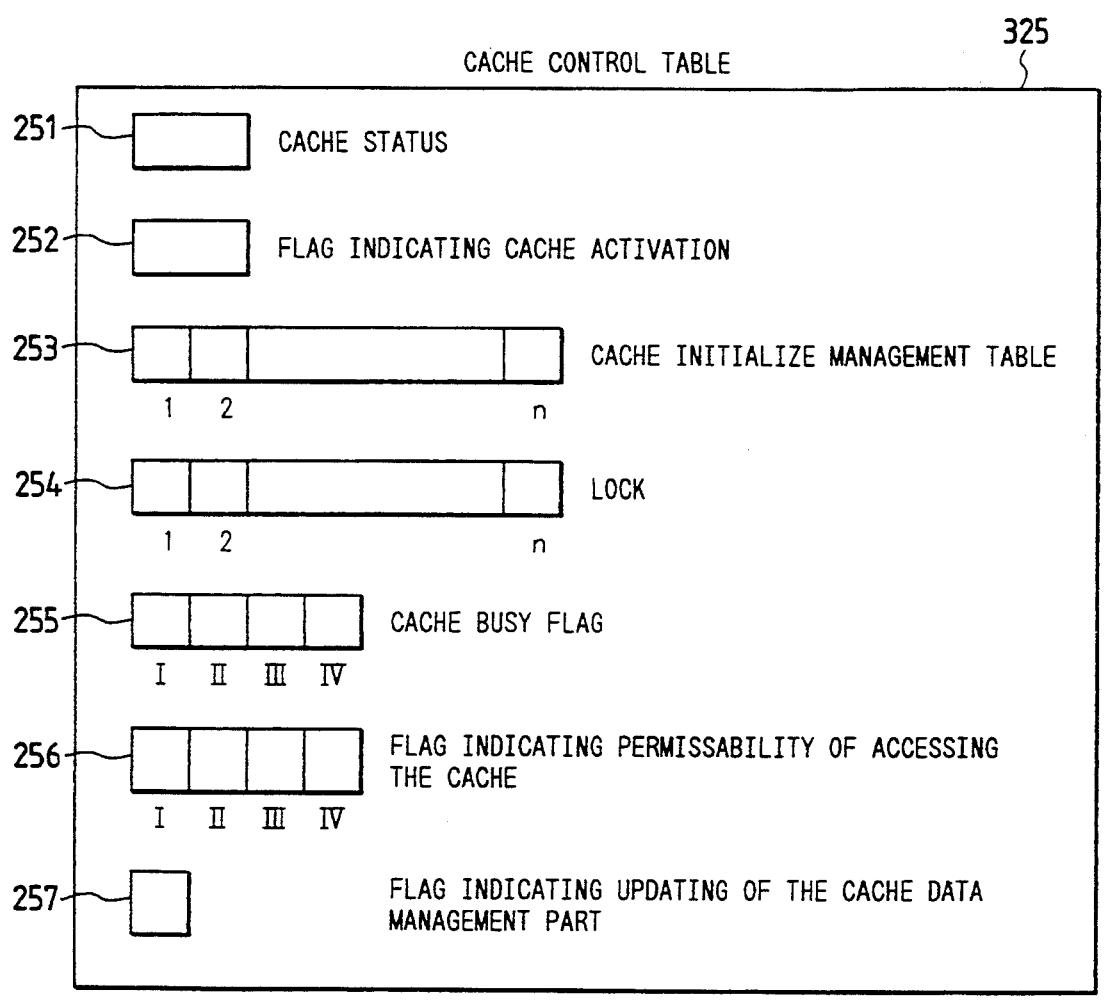
FIG. 7 is a block diagram showing the internal structure of a cache control table of a computer system according to a fourth embodiment of the present invention.

FIG. 7 is a block diagram showing the internal structure of a cache control table 325 of a computer system in case the system of FIG. 5 uses four processors (i.e., 1, II, III and IV).

The cache control table 325 is composed of a flag 256 indicating permissibility of accessing the cache and a flag 257 indicating updating of the cache data management part, in addition to the cache status 251, the flag indicating a request for cache activation 252, the cache initialize management table 253, the lock 254 and the cache busy flag 255, all of which have been described with reference to FIG. 5.

The flag 256 indicating the permissibility of accessing the cache is provided with 1 bit per processor and indicates whether or not each processor is permitted to access the cache. The value "1" indicates the permissibility of accessing, and the value "0" indicates the impermissibility.

The flag 257 indicating the permissibility of accessing the cache indicates whether or not the not-shown cache data management part is being updated. The flag 257 is raised to "1", immediately before the processors (1, II, III and IV) update the cache data management part, and is dropped to "0" after the end of the update.

Figure 8:
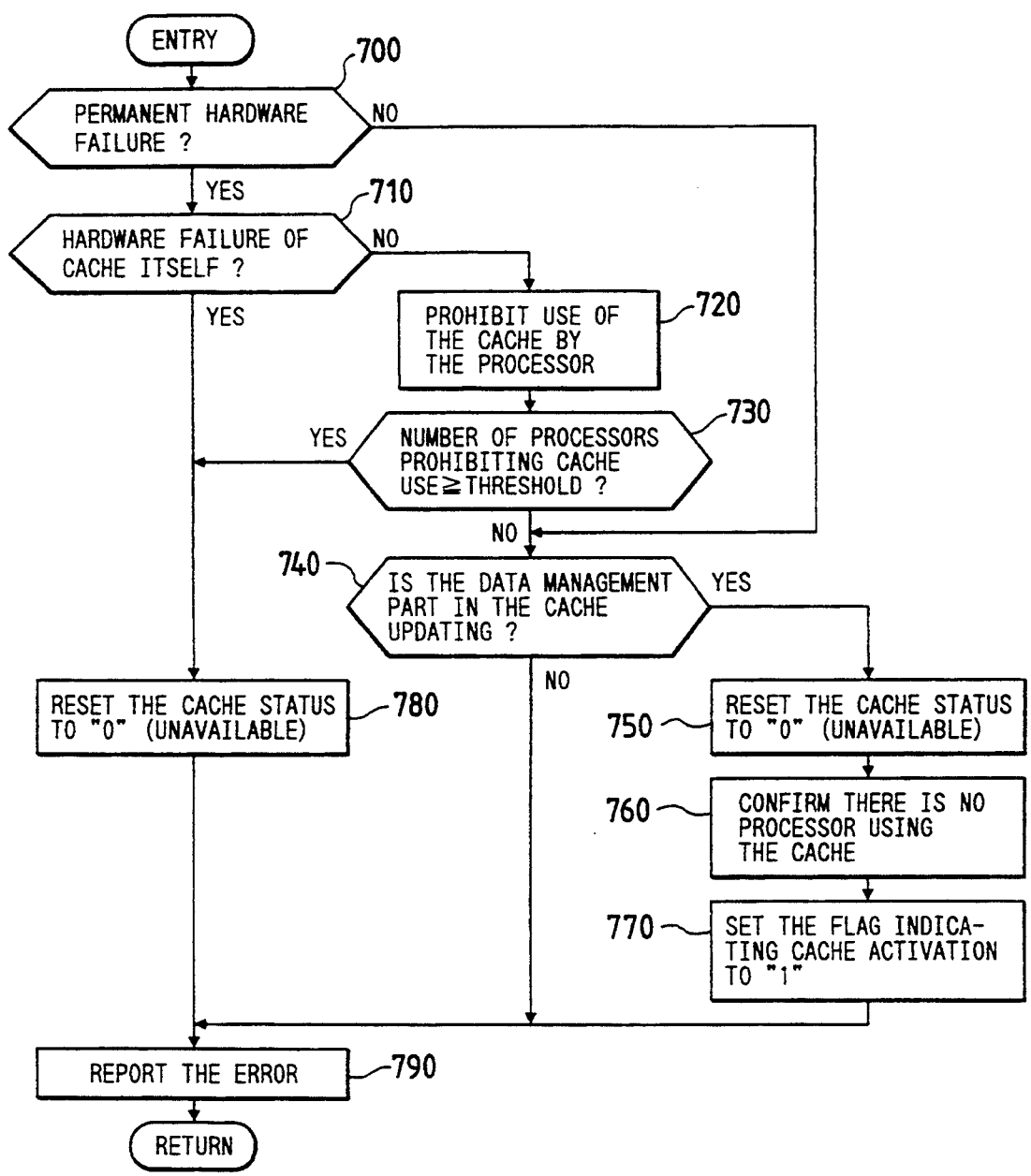
FIG. 8 is a flow chart showing the processing procedures when a failure occurs during the cache access in the computer system of FIG. 7.

FIG. 8 is a flow chart showing the processing procedure when a failure occurs during cache access in the computer system having the cache table of FIG. 7.

First of all, it is examined (at Step 700) whether or not the cause for a failure is a permanent hardware one. In the case of the permanent hardware failure, it is then examined (at Step 710) whether or not the hardware failure is the failure of the cache itself.

In the case of a hardware failure of the cache itself, it is impossible to continue the cache use, and the cache status 251 is reset to "0" (at Step 780). Then, the failure process is ended by reporting the error (at Step 790).

In case it is decided at Step 710 that the hardware failure is one other than that of the cache itself, the failure is assumed to be an access path failure between the processors (I to IV) and the cache. At first, therefore, the corresponding bit of the cache access permissibility indicating flag 256 is reset to "0" to prohibit the use of the cache by the processor (at Step 720). Then, it is examined (at Step 730) whether or not the number of processors prohibiting the cache use, i.e., the number of "0" of the cache access permissibility indicating flag 256 exceeds the threshold. If YES, the cache status 251 is reset to "0" (at Step 780), and the failure process is ended by reporting the error (at Step 790).

If NO, i.e., in case the hardware failure is not permanent at Step 700, e.g., in case the power is temporarily turned off or in case the failure belongs to the processors, the cache data management part updating indicating flag 257 is checked to examine (at Step 740) whether or not the management information of the data in the cache is being updated when the failure occurs.

In case the cache data management part updating indicating flag 257 is at "0", the management information of the data in the cache is being read, or the data in the cache is being read and written so that the content of the cache is not broken. As a result, another trial can be made by using the same path or the path of another processor. Then, the failure process is ended by reporting the error (at Step 790).

In case the cache data management part updating indicating flag 257 is at "1", i.e., in case the management information of the data in the cache is being updated, the content of the cache may possibly have become invalid so that the cache cannot be continuously used. Since, however, the cache itself has experienced no failure in its hardware, the cache can be used again if it is initialized.

First of all, therefore, the cache status 251 is reset to "0" (at Step 750) to prohibit the use of the cache. Next, the end of the cache access having been started by the processors is awaited before the cache status is dropped to "0", and the cache busy flag 255 is checked to confirm (at Step 760) that there is no processor using the cache. At the end of this confirmation, the cache activation request indicating flag 252 is then set to "1" (at Step 770). Then, the error is reported (at Step 790) to end the failure process.

Subsequently, the cache activation control having been described with reference to FIG. 2 is executed to end the whole initialization of the cache. Then, the cache status is set to "1" to reopen the use of the cache.

Thus, according to the present embodiment, the use of the cache is temporarily prohibited to execute the initialization so that the cache can be used again, if there is no hardware failure even in case the content of the data in the cache has become invalid to make the continuous cache use impossible as a result of the occurrence of the failure. Thus, the cache can be promptly recovered.

According to the present invention, the cache can be initialized without blocking the disk input/output process thereby to maintain the online cache operation. In case, moreover, the hardware of the cache itself is normal even if there arises a failure which makes it impossible to secure the content of the cache, the cache can be automatically recovered for reuse during the online operation to enhance the availability of the disk controller having the cache thereby to improve the processing efficiency of the computer system.

What is claimed is:

1. A cache initialization method for use in a disk controller of a disk system, which operates under control of a host computer and includes a processor, a cache connected to said processor, and at least one storage path for controlling data transfer between said cache, said processor and a disk unit connected to said disk controller, comprising the steps of:

(a) partitioning the memory area of said cache into sub-parts for purposes of initializing the cache;
   (b) generating a request for cache activation when said processor operates to effect data transfer between said host computer and said disk unit with said cache being unused;
   (c) checking whether a read/write request to said disk unit has been issued from said host computer; and
   (d) when there is a request for cache activation and while said disk system is operating on-line to effect data transfers between said host computer and said disk unit in response to input/output requests from said host computer, initializing a sub-part of the memory area of said cache in response to said activation request, when a read/write request from said host computer is not awaiting processing, and activating at least said sub-part of said memory area of said cache which has been initialized after the initialization thereof has been completed, thereby effecting automatic recovery of said cache without interrupting on-line operations with said host computer.

2. A method according to claim 1, wherein the entire memory area of said cache is partitioned into said plurality of sub-parts, each sub-part being of a size which can be initialized within a time period which is sufficiently short that no time-out error will result if the host computer issues a read/write request during step (c).

3. A method according to claim 1, wherein each of said plurality of sub-parts of the memory area of said cache has an initialization time which is shorter than the time allowed for a read/write request waiting time.

4. A method according to claim 1, further comprising the steps of:

(e) repeating step (b) subsequent to step (d) and processing a read/write request from said host computer if a read/write request is awaiting processing; and
   (f) if step (e) indicates that a read/write request from the host computer is not awaiting processing, repeating steps (d) and (e) to initialize and activate another sub-part of the memory area of said cache until all sub-parts of the memory area have been initialized and activated.

5. A method according to claim 4, wherein said disk system is connected with a service processor, wherein the step (b) of generating a cache activation request is effected through said service processor after the repairing of a failure of said cache memory, and includes returning an acknowledge signal to said service processor from said disk system to acknowledge the cache activation request from said service processor; and further including the step of:

(g) communicating to said service processor the completion of cache initialization and cache activation or communicating failure of said cache activation due to occurrence of a failure.

6. A method according to claim 5, further comprising the step of:

(h) maintaining and controlling said cache, after having communicated a failure to said service processor, when a failure occurs in operation of said cache.

7. A method according to claim 1, wherein said step (c) comprises examining whether or not there is a read/write request for said disk unit from said host computer at every lapse of a constant time counted by a timer disposed in said disk system; and performing step (d) for initializing a sub-part of said memory area of said cache when no read request is found in step (c).

8. A method according to claim 1, wherein said disk system includes a plurality of storage paths and said processor is a control processor for controlling said storage paths, wherein step (d) comprises:

initializing a sub-part of the memory area of said cache using said control processor, when said control processor is not executing a read/write request of said disk unit, in response to the cache activation request which is generated when said control processor is operating without using said cache.

9. A method according to claim 1, wherein said step (b) comprises:

deciding whether or not a failure of said disk system is a hardware failure of said cache itself when it occurs during an access to said cache;
   deciding whether or not management information of the data in said cache is being updated; and
   prohibiting use of said cache temporarily, by said disk system, for a failure in which the hardware of said cache itself is normal and in which the management information of the data in said cache is being updated.

10. A method according to claim 9, wherein said disk system includes a plurality of storage paths and a plurality of control processors for controlling said storage paths, further comprising the step of:

initializing a sub-part of said memory area of said cache in step (c) after it has been confirmed that all of said control processors have stopped using said cache.

11. A disk controller for a disk system, which disk controller operates under control of a host computer and includes a processor, a cache connected to said processor, and at least one storage path for controlling data transfer between said cache, said processor and a disk unit connected to said disk controller, comprising:
 means for partitioning the memory area of said cache into sub-parts for purposes of initializing the cache;
 means for generating a request for cache activation when said processor operates to effect data transfer between said host computer and said disk unit with said cache being unused;
 means for checking whether a read/write request to said disk unit has been issued from said host computer;
 means for initializing a sub-part of the memory area of said cache, in response to said activation request, when a read/write request from said computer is not awaiting processing and while said disk system is operating on-line to effect data transfers between said host computer and said disk unit in response to input/output requests from said host computer;
 means for activating at least said sub-part of said memory area of said cache which has been initialized after the initialization thereof has been completed and while said disk system is still operating on-line with said host computer, thereby effecting automatic recovery of said cache without interrupting on-line operations with said host computer; and
 means for operating said checking means after said initialization and activation of a sub-part of said memory area of said cache has been completed and for processing a read/write request before a further sub-part is initialized if the presence of a read/write request is indicated by said checking means.

12. A disk controller according to claim 11, wherein the entire memory area of said cache is partitioned into said plurality of sub-parts, each sub-part being of a size which can be initialized within as time period which is sufficiently short that no time-out error will result if the host computer issues a read/write request during initialization.

13. A disk controller according to claim 11, further comprising:
 means for deciding whether or not a failure of said disk system is a hardware failure of said cache itself when a failure occurs during an access to said cache;
 means for deciding whether or not management information of data in said cache is being updated;
 means for prohibiting use of said cache temporarily, by said disk system, upon occurrence of a failure in which the hardware of said cache itself is normal and in which management information of data in said cache is being updated.

14. A disk controller according to claim 13, wherein said disk means further comprises a plurality of storage paths; a plurality of control processors for controlling said storage paths; and means for initializing a sub-part of said memory area of said cache after it has been confirmed that all of said control processors have stopped use of said cache.

* * * * *